(12) United States Patent
Terashima (10) Patent No.: US 8,772,903 B2
(45) Date of Patent: Jul. 8, 2014

(54) SEMICONDUCTOR DEVICE WITH REDUCED POTENTIAL BETWEEN ADJACENT FLOATING REGIONS

(75) Inventor: Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/181,974

(22) Filed: Jul. 13, 2011

(65) Prior Publication Data

US 2012/0168767 A1    Jul. 5, 2012

(30) Foreign Application Priority Data

Dec. 29, 2010  (JP) ................... 2010-294408

(51) Int. Cl.
*H01L 29/92*    (2006.01)
(52) U.S. Cl.
USPC ............ 257/508; 257/77; 257/487; 257/488; 257/507; 257/532; 257/E29.008
(58) Field of Classification Search
USPC ......... 257/112, 506–527, 168–171, 288–413, 257/487–503, 29.008
See application file for complete search history.

(56) References Cited

U.S. PATENT DOCUMENTS

| | | | | |
|---|---|---|---|---|
| 5,204,545 | A * | 4/1993 | Terashima | 257/490 |
| 5,270,568 | A * | 12/1993 | Terashima | 257/487 |
| 6,469,359 | B2 * | 10/2002 | Bakowski et al. | 257/487 |
| 6,750,506 | B2 * | 6/2004 | Noda et al. | 257/328 |
| 6,921,945 | B2 * | 7/2005 | Terashima | 257/347 |
| 7,417,296 | B2 * | 8/2008 | Akiyama | 257/500 |
| 7,582,946 | B2 * | 9/2009 | Shimizu | 257/501 |
| 8,071,461 | B2 * | 12/2011 | Ren et al. | 438/425 |
| 2010/0163987 | A1 * | 7/2010 | Nakagawa | 257/341 |

FOREIGN PATENT DOCUMENTS

| | | |
|---|---|---|
| CN | 1207791 C | 6/2005 |
| CN | 100474620 C | 4/2009 |
| JP | 6-216231 | 8/1994 |
| JP | 2000-243978 | 9/2000 |
| JP | 2007-027358 | 2/2007 |

OTHER PUBLICATIONS

Chinese Office Action issued Dec. 26, 2013 in corresponding Patent Application No. 201110461907.4 (with partial English Translation), (25 pages).
Japanese Office Action dated Apr. 8, 2014 issued in JP Application No. 2010-294408 (with Partial English Translation).

* cited by examiner

*Primary Examiner* — Mark Tornow
*Assistant Examiner* — Eric Ward
(74) *Attorney, Agent, or Firm* — Oblon, Spivak, McClelland, Maier & Neustadt, L.L.P.

(57) ABSTRACT

A semiconductor device includes a plurality of floating regions, an insulating layer and a capacitance forming portion. The plurality of floating regions are arranged on a surface of a semiconductor substrate in a row, wherein the plurality of floating regions are provided with insulating regions therebetween. The plurality of floating regions include a first floating region and a second floating region. The second floating region is located farther than the first floating region from an island region of a predetermined potential on the semiconductor substrate. The insulating layer is interposed between each of the plurality of floating regions and a semiconductor material layer of the semiconductor substrate. The capacitance forming portion forms an external capacitance in parallel with the capacitance of the insulating region between the first floating region and the island region of the predetermined potential.

18 Claims, 6 Drawing Sheets

Fig. 12

SEMICONDUCTOR DEVICE WITH REDUCED POTENTIAL BETWEEN ADJACENT FLOATING REGIONS

FIELD OF THE INVENTION

The present invention relates to a semiconductor device having a plurality of different potential regions therein.

BACKGROUND ART

Semiconductor devices provided with a structure for increasing the breakdown voltage have been known, as disclosed, e.g., in Japanese Laid-Open Patent Publication No. 2000-243978. Specifically, this publication relates to providing a highly reliable high voltage semiconductor device which does not exhibit degradation of the breakdown voltage (or withstand voltage) of its pn junction under a high temperature bias reliability test. The semiconductor device disclosed in the publication includes a p-type diffusion region and an n-type diffusion region formed on an n-type semiconductor substrate, first layer plate electrodes disposed on an oxide film between these diffusion regions, and second layer plate electrodes disposed on an interlayer insulating film on the first layer plate electrodes. Thus, these plate electrodes are arranged over the pn junction and capacitively coupled to one another, thereby increasing the breakdown voltage of the pn junction.

Other prior art includes Japanese Laid-Open Patent Publication No. H06-216231.

Figure 10:
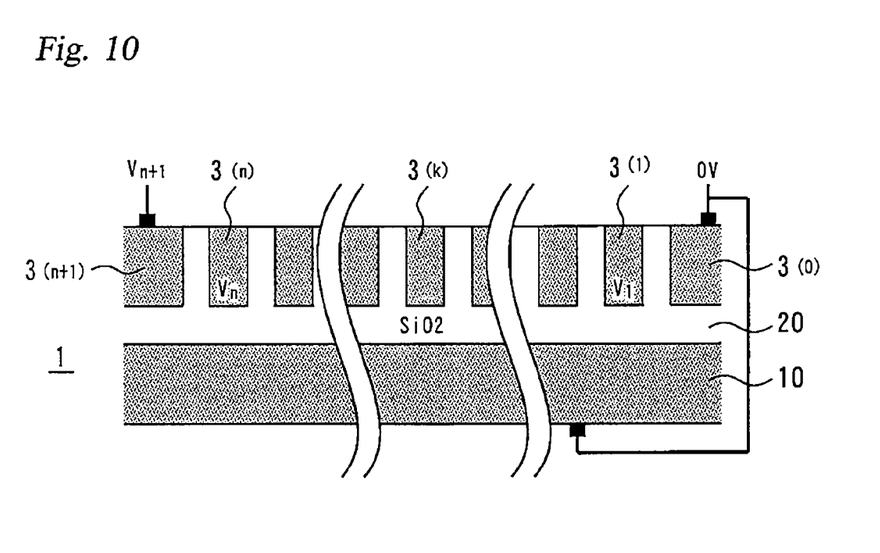
FIG. 10 is across-sectional side view of a semiconductor device, and will be used to describe the problem sought to be solved by the present invention.

Incidentally, the present inventor has intensively studied the configurations of semiconductor devices, such as ICs (integrated circuits), having a plurality of different potential regions therein in order to increase the breakdown voltage of the devices, and found the following:

FIG. 10 is a cross-sectional side view of a semiconductor device, and will be used to describe the problem sought to be solved by the present invention. The semiconductor device shown in FIG. 10 is provided with a substrate 1, an insulating layer 20, and a plurality of regions 3 of different potentials. The semiconductor substrate 1 is a so-called SOI (silicon on insulator) wafer including a semiconductor material layer 10 and the insulating layer 20, which is an $SiO_2$ insulating film. The regions 3 are island regions on this SOI wafer which are separated and isolated from each other. In the following description, the plurality of regions 3 are denoted by reference numerals $3(0), 3(1), \ldots, 3(k), 3(k+1), \ldots 3(n)$, and $3(n+1)$ to distinguish them, where k and n are positive integers. (That is, there are n+2 number of regions 3.)

These different potential regions $3(0)$ to $3(n+1)$ are separated and isolated by trenches. The n intermediate regions $3(1)$ to $3(n)$ disposed between the rightmost region $3(0)$ and the leftmost region $3(n+1)$, as viewed in FIG. 10, are floating regions which are in a floating state and are of substantially the same configuration. These floating regions $3(1)$ to $3(n)$ are also hereinafter referred to collectively as the floating regions $3(k)$ for convenience of explanation, that is, k is a positive integer from 1 to n. As shown in FIG. 10, a potential of 0 (V) is applied to the rightmost region $3(0)$ and a potential of $V_{n+1}(V)$ is applied to the leftmost region $3(n+1)$. The voltage (or potential difference) between the rightmost and leftmost regions $3(0)$ and $3(n+1)$ is capacitively divided so that the regions $3(1)$ to $3(n)$ are at different potentials. The potentials of the regions $3(1)$ to $3(n)$ are designated by $V_1, V_2, \ldots, V_k, \ldots, V_n$, respectively. Thus, as shown in FIG. 10, the high voltage $V_{n+1}$ between the regions $3(0)$ and $3(n+1)$ is capacitively divided by the capacitances formed between the regions $3(0)$ to $3(n+1)$, thereby increasing the overall breakdown voltage of the device.

Figure 11:
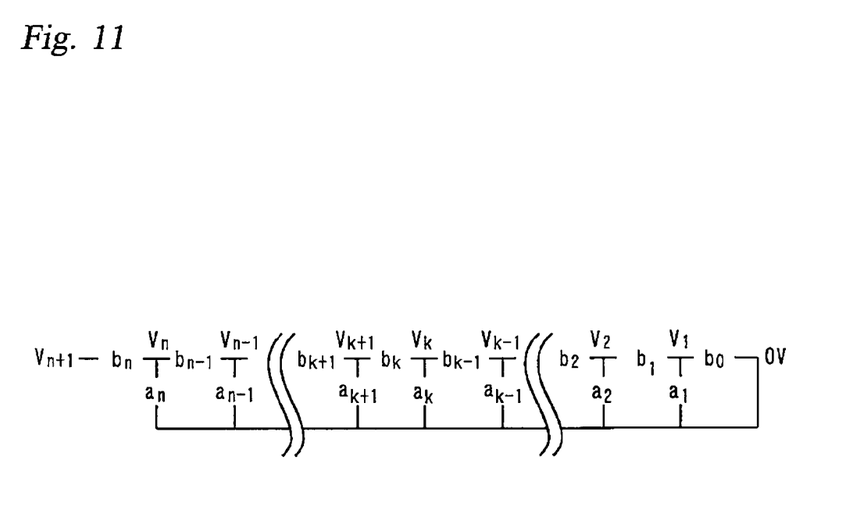
FIG. 11 is an equivalent circuit diagram of the structure of FIG. 10.

However, the present inventor has found that the above breakdown voltage increasing method using a capacitive divider has the following disadvantage:

FIG. 11 is an equivalent circuit diagram of the structure of FIG. 10. Let $a_k$ represent the capacitance between the region $3(k)$ and the substrate, and $b_k$ represent the capacitance between the region $3(k)$ and the region $3(k+1)$, where k is 0 or a positive integer. Then the following relations hold:

$$b_1(V_2 - V_1) = b_c V_1 + a_1 V_1 \qquad (1)$$
$$b_k(V_{k+1} - V_k) = b_{k-1}(V_k - V_{k-1}) + a_k V_k$$

$$b_k(V_{k+1} - V_k) = b_0 V_1 + \sum_{j=1}^{k} a_j V_j \qquad (2)$$

If $a_k$ and $b_k$ are constant with respect to the value of k and are represented by a and b respectively, then the following equations hold $$\alpha = \frac{2 + a/b + \sqrt{\{a/b\}^2 + 4a/b}}{2} \qquad (3)$$

$$\beta = \frac{2 + a/b - \sqrt{\{a/b\}^2 + 4a/b}}{2}$$

$$V_k = ((\alpha^{k-1} - \beta^{k-1})V_2 + (\alpha\beta^{k-1} - \beta\alpha^{k-1})V_1)/(\alpha - \beta)$$

$$V_2 = (2 + a/b)V_1, \text{ and therefore}$$

$$V_k = V_1(\alpha^k - \beta^k)/(\alpha - \beta)$$

Since $\alpha>1$ and $\beta<1$, $V_k$ increases substantially proportionally with $\alpha^k$. This means that if $a_k$ and $b_k$ (or a and b) are constant with respect to the value of k, it is theoretically impossible to equalize the voltages between adjacent regions $3(k)$ and $3(k+1)$, that is, the voltages between the regions $3(0)$ and $3(1)$, between the regions $3(1)$ and $3(2)$, and so on. It should be noted that when a<<b, $V_k \approx kV_1$. However, in the structure of FIG. 10, this condition is difficult to achieve, since $a_k/b_k$ is substantially constant with respect to the value of k.

Thus, the breakdown voltage increasing method described above with reference to FIG. 10, which uses a capacitive divider made up of successively arranged floating regions $3(k)$, is disadvantageous in that the voltages between adjacent floating regions $3(k)$ are not equal and increase with decreasing distance from the high potential end of the device. As a result, different voltage stresses are applied to the separation trenches, resulting in a reduced overall breakdown voltage and reduced reliability.

The present invention has been made to solve the above problems. It is, therefore, an object of the present invention to provide a semiconductor device wherein the differences between the voltages between a plurality of adjacent floating regions are reduced.

SUMMARY OF THE INVENTION

According to a first aspect of the present invention, a semiconductor device includes a plurality of floating regions, an insulating layer and a capacitance forming portion. The plurality of floating regions are arranged on a surface of a semiconductor substrate in a row, wherein the plurality of floating regions are provided with insulating regions therebetween. The plurality of floating regions include a first floating region and a second floating region. The second floating region is located farther than the first floating region from an island region of a predetermined potential on the semiconductor substrate. The insulating layer is interposed between each of the plurality of floating regions and a semiconductor material layer of the semiconductor substrate. The capacitance forming portion forms an external capacitance in parallel with either the capacitance of the insulating region between the first floating region and the island region of the predetermined potential, or the capacitance of the insulating region between each adjacent pair of one or more of the plurality of floating regions, or both, the one or more floating regions including the first floating region.

According to a second aspect of the present invention, a semiconductor device includes a plurality of floating regions, an insulating layer and a capacitance forming portion. The plurality of floating regions are arranged on a surface of a semiconductor substrate in a row, wherein the plurality of floating regions are provided with insulating regions therebetween. The plurality of floating regions include a first floating region and a second floating region. The second floating region is located farther than the first floating region from an island region of a predetermined potential on the semiconductor substrate. The insulating layer is interposed between each of the plurality of floating regions and a semiconductor material layer of the semiconductor substrate. The capacitance forming portion extends either along and above the semiconductor substrate, or along a side of the row of the plurality of floating regions on the surface of the semiconductor substrate, or both, so that the capacitance forming portion is capacitively coupled to one or more of the plurality of floating regions, the one or more floating regions including the first floating region.

In accordance with the first aspect of the present invention there is provided a semiconductor device in which a capacitance forming portion provides capacitances to reduce the differences between the voltages between adjacent floating regions.

In accordance with the second aspect of the present invention there is provided another semiconductor device in which a capacitance forming portion provides capacitances to reduce the differences between the voltages between adjacent floating regions.

DETAILED DESCRIPTION OF THE PREFERRED EMBODIMENTS

First Embodiment

Figure 1:
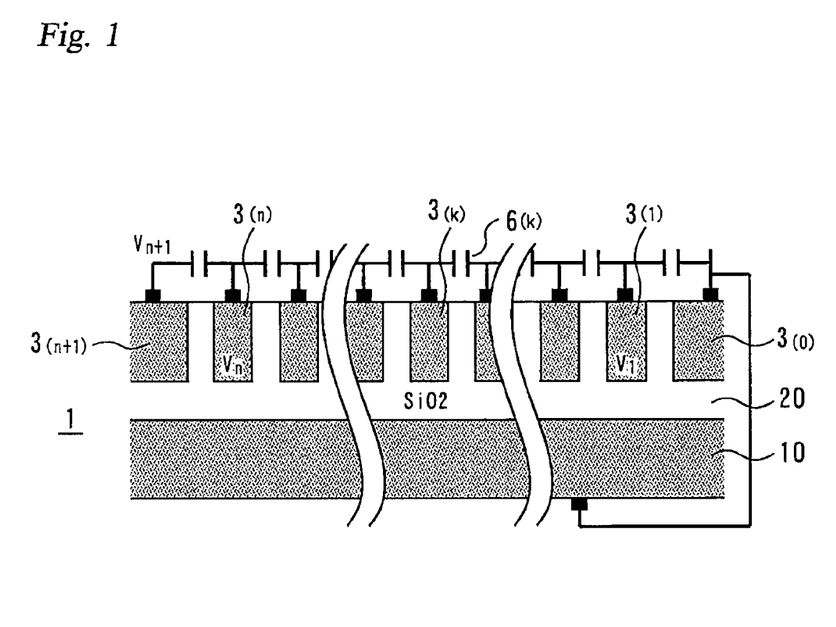
FIG. 1 is a cross-sectional side view of a semiconductor device in accordance with a first embodiment of the present invention.

FIG. 1 is a cross-sectional side view of a semiconductor device in accordance with a first embodiment of the present invention. Specifically, in accordance with the first embodiment, the invention is applied to a plurality of floating regions in an IC (integrated circuit) having a plurality of different potential regions therein.

The semiconductor device of the first embodiment, like that shown in FIG. 10, includes a substrate 1, an insulating layer 20 which is an $SiO_2$ insulating film, and a plurality of different potential regions 3. Further, the substrate 1 of this semiconductor device, like that of the semiconductor device shown in FIG. 10, is a so-called SOI (silicon on insulator) wafer including a semiconductor material layer 10 and the insulating layer 20, and the regions 3 are island regions on this SOI wafer which are separated and isolated from each other.

In the following description, the plurality of regions 3 are denoted by reference numerals 3(0), 3(1), ..., 3(k), 3(k+1), ... 3(n), and 3(n+1) to distinguish them, where k and n are positive integers. (That is, there are n+2 number of regions 3.) Further, in the following description, the symbol $a_k$ may represent the capacitance between the region 3(k) and the substrate, and $b_k$ may represent the capacitance between the region 3(k) and the region 3(k+1), where k is 0 or a positive integer, as in FIG. 11 which is an equivalent circuit diagram of the structure of FIG. 10.

In the semiconductor device of the first embodiment, like that shown in FIG. 10, the different potential regions 3(0) to 3(n+1) are separated and isolated from each other by trenches. The n intermediate regions 3(1) to 3(n), as viewed in FIG. 1, are in a floating state and are of substantially the same configuration. These floating regions 3(1) to 3(n) are also hereinafter referred to collectively as the floating regions 3(k) for convenience of explanation, that is, k is a positive integer from 1 to n. In the semiconductor device of the first embodiment, like that shown in FIG. 10, the voltage between the rightmost region 3(0) and the leftmost region 3(n+1), as viewed in FIG. 1, is capacitively divided by the capacitances formed between adjacent regions 3(k) and 3(k+1).

As shown in FIG. 1, the semiconductor device of the first embodiment includes a plurality of external capacitances 6(k) each provided between adjacent regions 3(k) and 3(k-1). These external capacitances 6(k) may be MOS capacitors connected to one another by aluminum wiring. The values of the plurality of external capacitances 6(k) increase with increasing value of k. (That is, the values of these external capacitances 6(k) increase with decreasing distance from the leftmost region 3(n+1), as viewed in FIG. 1.) This structure serves to reduce the differences between the voltages between adjacent floating regions 3(k) and 3(k+1).

Specifically, in Equation (1) above, let it be assumed that $V_{k+1}-V_k=V_1$ and $V_1$ is constant. Then, $V_k=k*V_1$, leading to Equation (4) below.

$$b_k = b_0 + \sum_{j=1}^{k} a_j j \qquad (4)$$

It follows from Equation (4) and the inequality $a_j j>0$ that, in order to equalize the voltages between adjacent floating regions $3(k)$ and $3(k+1)$, it is necessary that the values of the capacitances $b_k$ increase with increasing value of k. In accordance with the first embodiment, the values of the external capacitances $6(k)$ are selected to increase with increasing value of k so that the requirement described above is met, thereby reducing the differences between the voltages between adjacent regions $3(k)$ and $3(k+1)$.

It should be noted that the differences between the voltages between adjacent regions $3(k)$ and $3(k+1)$ increase with decreasing distance from the high potential end of the device. Therefore, an effective way to reduce the differences between the voltages between adjacent regions 3 is to connect external capacitances 6 only to regions 3 on the high potential side of the structure. Therefore, in a variation of the first embodiment, external capacitances 6 may be connected to only one or a few regions 3 on the left side of the structure, as viewed in FIG. 1 (i.e., connected to the regions $3(n)$, $3(n-1)$, etc.).

Second Embodiment

A second embodiment of the present invention provides a diode having a structure similar to that of the semiconductor device of the first embodiment and thereby having an increased breakdown voltage. This diode structure of the second embodiment makes it possible to reduce the differences between the voltages between adjacent floating regions, resulting in an increased breakdown voltage of the diode.

Figure 12:
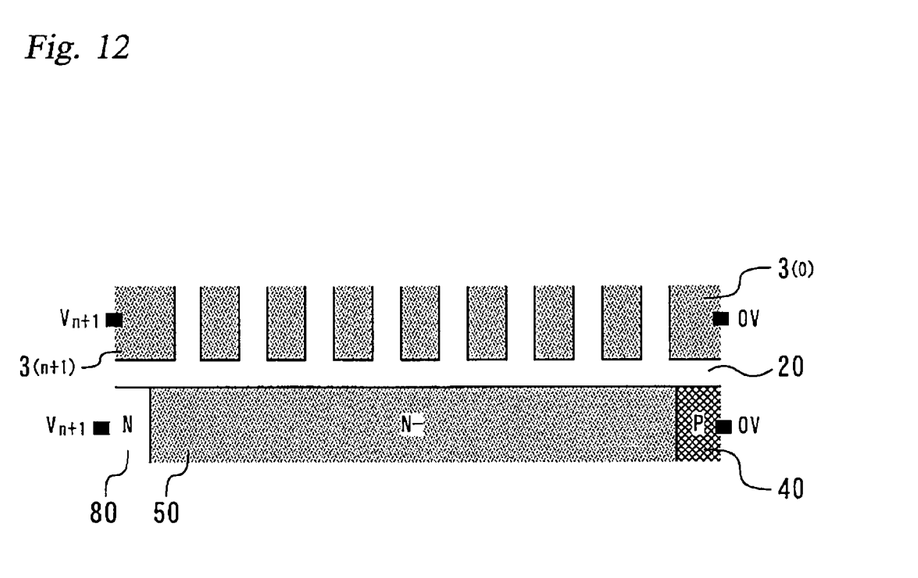
FIG. 12 is a top view of a semiconductor device, and will be used to describe the problems sought to be solved by the second embodiment before describing the semiconductor device of the second embodiment.

FIG. 12 is a top view of a semiconductor device, and will be used to describe the problems sought to be solved by the second embodiment before describing the semiconductor device of the second embodiment. FIG. 12 is a top view of a structure similar to that shown in FIG. 10 which shows a cross-sectional view. However, the structure shown in FIG. 12 differs from that shown in FIG. 10 in that it includes a diode including n-type regions 80 and 50 and a p-type region 40. Further, although, for simplicity, FIG. 12 only shows floating regions $3(k)$ on one side of the diode, in reality floating regions $3(k)$ are disposed on both sides of the diode shown in FIG. 12. Specifically, other floating regions $3(k)$ are disposed on the lower side of the diode, as viewed in FIG. 12, and the upper and lower floating regions $3(k)$ are arranged in symmetrical configuration with respect to the diode. This configuration makes it possible to reduce the differences between the voltages between adjacent floating regions $3(k)$, thereby suppressing electric field concentration in the depletion layer of the diode and increasing the breakdown voltage.

However, as described above, the structure shown in FIG. 10 (which is similar to the structure shown in FIG. 12) is disadvantageous in that the voltages between adjacent floating regions $3(k)$ are bound to differ from one another. This significantly degrades the breakdown voltage of the diode.

In accordance with the second embodiment, in order to avoid the above problem, a structure similar to that of the semiconductor device of the first embodiment is applied to the regions $3(0)$ to $3(n+1)$ shown in FIG. 12. Specifically, a plurality of external capacitances 6 are connected to a plurality of regions 3 shown in FIG. 12, as in the first embodiment shown in FIG. 1. In this structure of the semiconductor device of the second embodiment, the floating regions disposed on both sides of the pn junction serve to reduce the electric field in the depletion layer extending the pn junction and thereby increase the breakdown voltage of the pn junction.

It should be noted that although in the second embodiment the structure of the first embodiment is applied to a diode (a semiconductor element), it is to be understood that the structure of the first embodiment may be applied to other semiconductor elements to increase the breakdown voltage.

Third Embodiment

A semiconductor device in accordance with a third embodiment of the present invention is a variation of the semiconductor device of the first embodiment in which the values of the external capacitances $6(k)$ are such that the capacitances $b_k$ between adjacent regions $3(k)$ increase as a quadratic function of k. This structure makes it possible to substantially equalize the voltages between adjacent floating regions 3.

In Equation (4) above, if $a_k$ is constant with respect to the value of k, the following equation holds:

$$b_k=b_0+ak(k+1)/2 \qquad (5)$$

Therefore, the values of the plurality of external capacitances $6(k)$ may be selected so that the capacitances $b_k$ increase as a quadratic function of k to substantially equalize the voltages between adjacent regions $3(k)$.

Fourth Embodiment

A semiconductor device in accordance with a fourth embodiment of the present invention is a variation of the semiconductor device of FIG. 12 described in connection with the second embodiment and has a structure similar to that of the semiconductor device of the third embodiment. Specifically, the semiconductor device of the fourth embodiment includes regions $3(0)$ to $3(n+1)$ and external capacitances $6(k)$ connected these regions, and the values of the external capacitances $6(k)$ are such that the values of $b_k$ increase as a quadratic function of k, as in the third embodiment. This structure also makes it possible to substantially equalize the voltages between adjacent floating regions $3(k)$ and thereby maximize the breakdown voltage of the pn junction.

Fifth Embodiment

Figure 2:
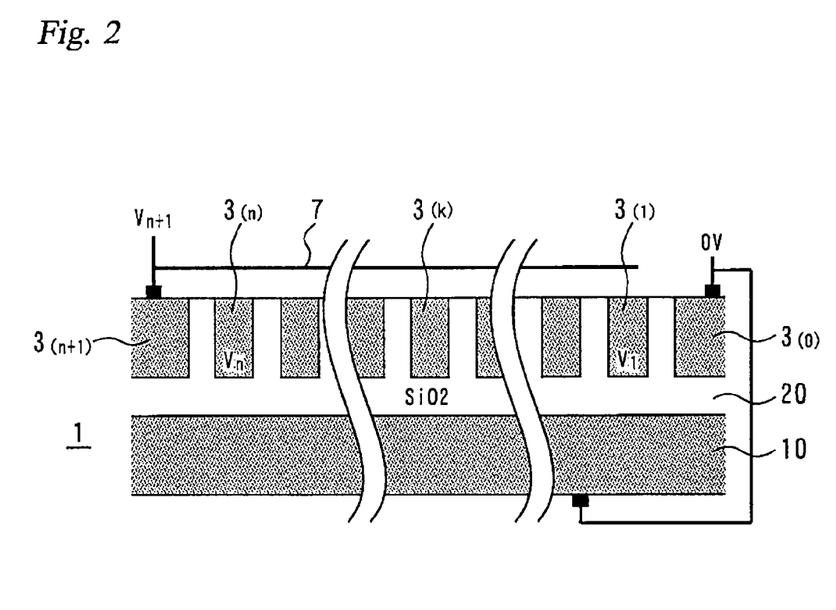
FIG. 2 is a cross-sectional side view of a semiconductor device in accordance with a fifth embodiment of the present invention.

FIG. 2 is a cross-sectional side view of a semiconductor device in accordance with a fifth embodiment of the present invention. This semiconductor device differs from that of the first embodiment in that the external capacitances 6 are omitted and an electrode 7 is connected to the region $3(n+1)$ on the high potential end (at a potential of $V_{n+1}$ V). The electrode 7 extends along and above at least some of the floating regions $3(k)$ so that the electrode 7 (at a potential of $V_{n+1}$ V) is capacitively coupled to these floating regions.

In FIG. 2, the electrode 7 is shown to be a thin line for simplicity. In reality, however, the electrode 7 has a predetermined thickness and is connected to the region $3(n+1)$. The electrode 7 is spaced a predetermined distance from and extends along the surface of the substrate 1 (i.e., the surfaces of the floating regions 3) toward the right end of the structure, as viewed in FIG. 2. The electrode 7 may be formed, e.g., by first forming an insulating film on the regions $3(1)$ to $3(n)$, then forming aluminum wiring on this insulating film, and connecting the aluminum wiring to the region $3(n+1)$. In accordance with the present embodiment, the electrode 7 extends to a position directly above the region $3(1)$.

Figure 3:
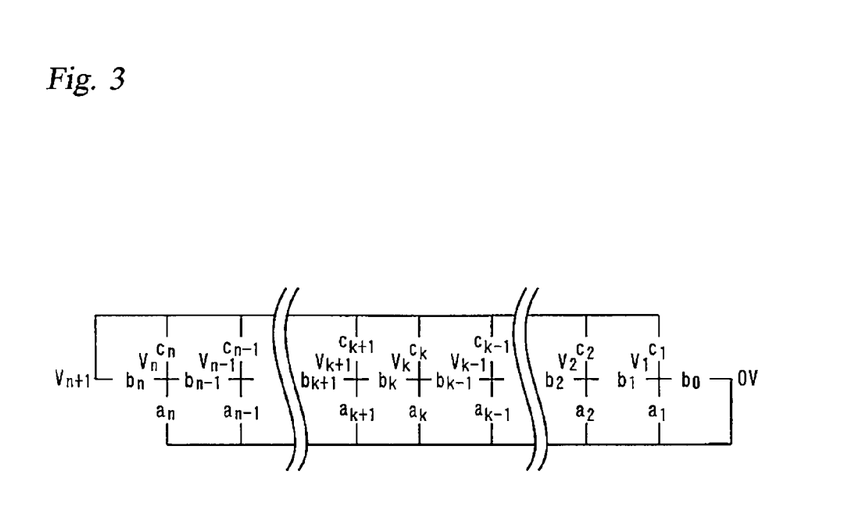
FIG. 3 is an equivalent circuit diagram of the structure of the semiconductor device of the fifth embodiment.

FIG. 3 is an equivalent circuit diagram of the structure of the semiconductor device of the fifth embodiment. From this circuit diagram the following equations can be derived.

$$b_1(V_2-V_1)=b_0V_1+a_1V_1-c_1(V_{n+1}-V_1)$$

$$b_k(V_{k+1}-V_k)=b_{k-1}(V_k-V_{k-1})+a_kV_k-c_k(V_{n+1}-V_k) \quad (6)$$

Due to the third term on the right-hand side of Equation (6), the values of the capacitances $b_k$ increase more slowly with increasing value of k than in the case of the semiconductor device of the first embodiment.

Let it be assumed that $a_k$, $b_k$, and $c_k$ are constant with respect to the value of k and are represented by a, b, and c, respectively and $\gamma=c*V_{n+1}/b$. Then the following equations hold.

$$\alpha = \frac{2+(a+c)/b + \sqrt{\{(a+c)/b\}^2+4(a+c)/b}}{2} \quad (7)$$

$$\beta = \frac{2+(a+c)/b - \sqrt{\{(a+c)/b\}^2+4(a+c)/b}}{2}$$

$V_2 = (2+(a+c)/b)V_1 - \gamma$, and therefore $$V_k = [V_1(\alpha^k-\beta^k) - \gamma\{(\alpha^k-1)/(\alpha-1) - (\beta^k-1)/(\beta-1)\}]/(\alpha-\beta)$$

Equation (7) indicates that in the semiconductor device of the fifth embodiment it is possible to more nearly equalize the voltages ($V_k-V_{k-1}$) between adjacent floating regions $3(k)$ than in the semiconductor of the first embodiment.

In general, the voltages between adjacent floating regions $3(k)$ and $3(k+1)$ increase with decreasing distance from the high potential end (i.e., the region $3(n+1)$). Therefore, if the dielectric strength between the extended electrode and the underlying floating regions 3 must exceed a certain minimum value, the electrode 7 may extend from the high potential end (i.e., the region $3(n+1)$) only halfway along the row of floating regions 3. That is, the electrode 7 may not extend as close to the rightmost region $3(0)$ as shown in FIG. 2. For example, the electrode 7 may extend only along the upper side of one or a few regions 3 on the left side of the structure (i.e., the regions $3(n)$, $3(n-1)$, etc.), as viewed in FIG. 2.

Practically, the formation of the electrode 7 can be achieved merely by changing the mask pattern. Therefore, the semiconductor device of the fifth embodiment can be more easily manufactured than the semiconductor device of the first embodiment in which a plurality of external capacitances 6 are connected to the regions 3.

It should be noted that, instead of connecting the electrode 7 as shown in FIG. 2, one or more capacitances may be connected between the voltage line $V_{n+1}$ and floating regions $3(k)$ so as to form the capacitances $c_k$ in the equivalent circuit of FIG. 3.

Sixth Embodiment

Figure 4:
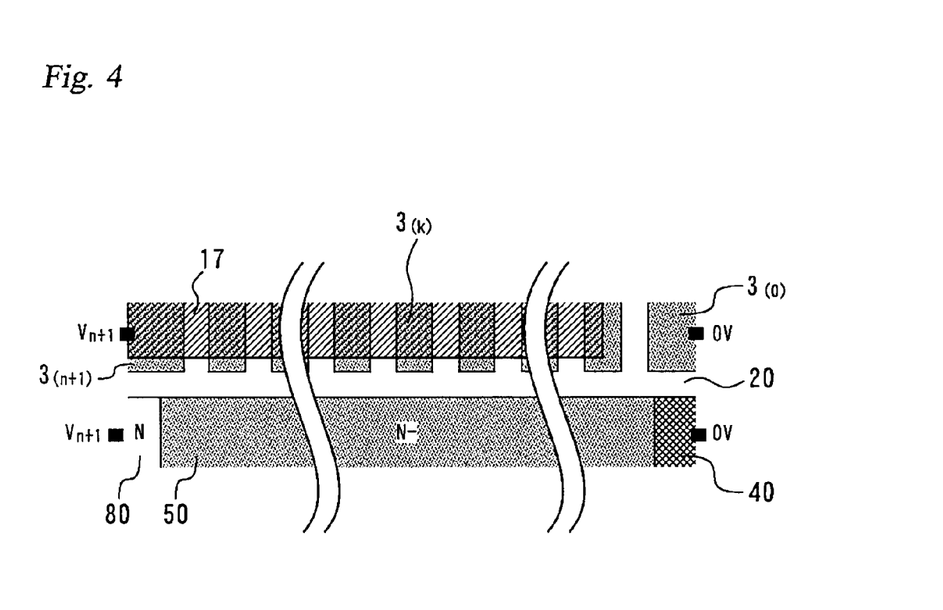
FIG. 4 is a top view of a semiconductor device in accordance with a sixth embodiment of the present invention.

FIG. 4 is a top view of a semiconductor device in accordance with a sixth embodiment of the present invention. The semiconductor device (or diode) of the sixth embodiment is a variation of the semiconductor device shown in FIG. 12 and has a structure similar to that of the semiconductor device of the fifth embodiment. Specifically, in accordance with the technical idea described in connection with the fifth embodiment, this semiconductor device includes an electrode 17 similar to the electrode 7 of the fifth embodiment. This electrode 17 serves to reduce the differences between the voltages between adjacent floating regions $3(k)$, thereby increasing the breakdown voltage of the pn junction of the diode (described with reference to FIG. 12).

Seventh Embodiment

Figure 5:
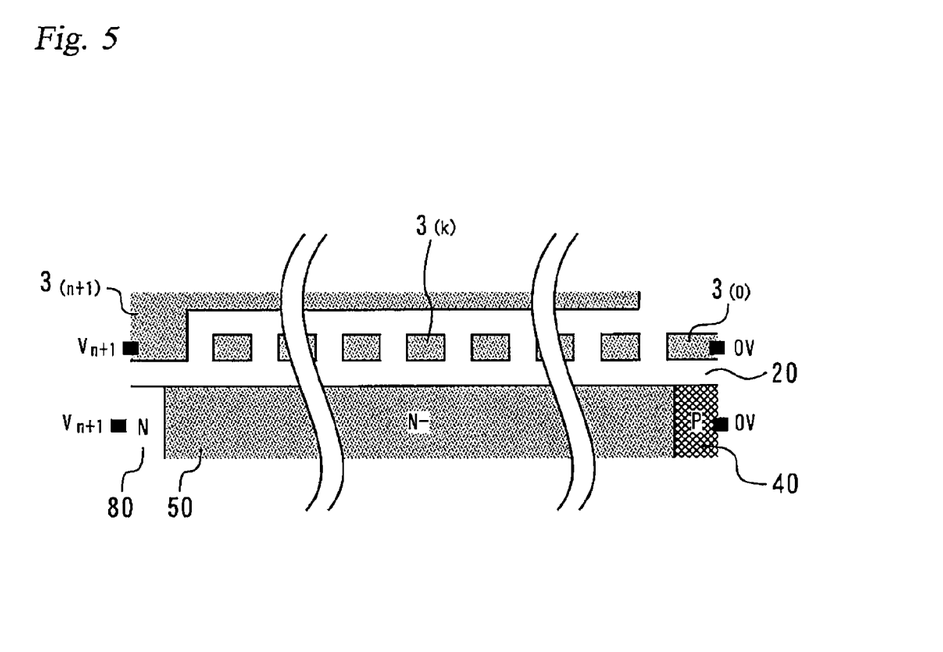
FIG. 5 is a top view of a semiconductor device in accordance with a seventh embodiment of the present invention.

FIG. 5 is a top view of a semiconductor device in accordance with a seventh embodiment of the present invention. This semiconductor device (or diode) has the same advantages as the semiconductor device of the sixth embodiment shown in FIG. 4, but has a different structure. Specifically, in the semiconductor device of the seventh embodiment, the region $3(n+1)$ at a potential of $V_{n+1}$ extends along a side of the row of floating regions $3(k)$, as shown in FIG. 5, so that the region $3(n+1)$ is capacitively coupled to these floating regions $3(k)$. It should be noted that, in accordance with the above-described fact with respect to the breakdown voltage of the separation trenches, the region $3(n+1)$ may extend so that it is capacitively coupled to only some floating regions $3(k)$ on the high potential side of the structure. Such configurations also provide beneficial effects. Thus, the semiconductor device of the seventh embodiment has the same advantages as the semiconductor device of the sixth embodiment but without the electrode 7.

Eighth Embodiment

Figure 6:
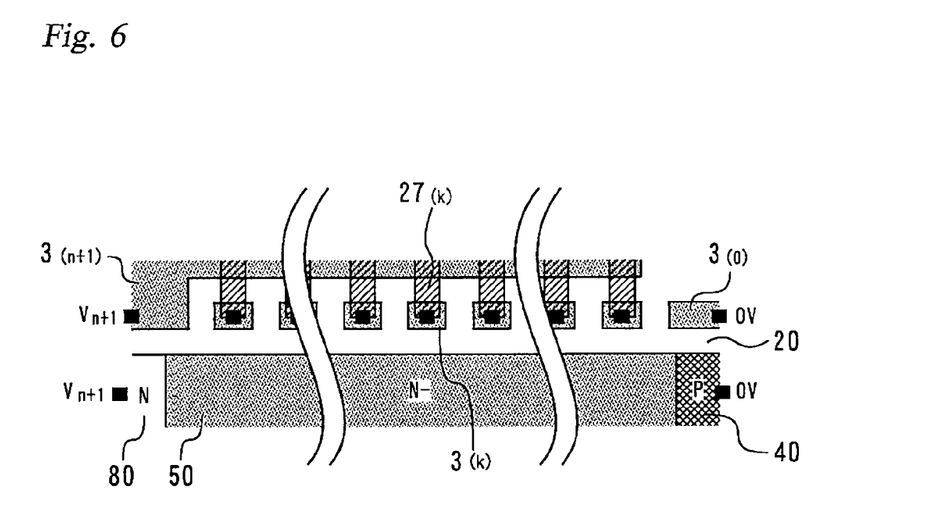
FIG. 6 is a top view of a semiconductor device in accordance with a eighth embodiment of the present invention.

FIG. 6 is a top view of a semiconductor device in accordance with an eighth embodiment of the present invention. The semiconductor device of the eighth embodiment differs from that of the seventh embodiment shown in FIG. 5 in that an electrode 27 extends from each floating region $3(k)$ toward the extended region $3(n+1)$ so that the electrode is capacitively coupled to the region $3(n+1)$. Specifically, in the present embodiment, single electrodes $27(1)$, . . . , $27(k)$, . . . , $27(n)$ extend from the floating regions $3(1)$, . . . , $3(k)$, . . . , $3(n)$, respectively, as shown in FIG. 6, where n and k are positive integers. Thus these electrodes 27 and the extended region $3(n+1)$ form capacitances which can be adjusted, making it easy to adjust the overall capacitances between the regions 3 over a wide range. It should be noted that if the dielectric strength between the regions 3 must exceed a certain minimum value, then only one or a few regions 3 on the high potential side of structure (e.g., the regions $3(n)$, $3(n-1)$, . . . ) may have an electrode 27 which is capacitively coupled to the region $3(n+1)$. Such configurations also provide beneficial effects.

Ninth Embodiment

Figure 7:
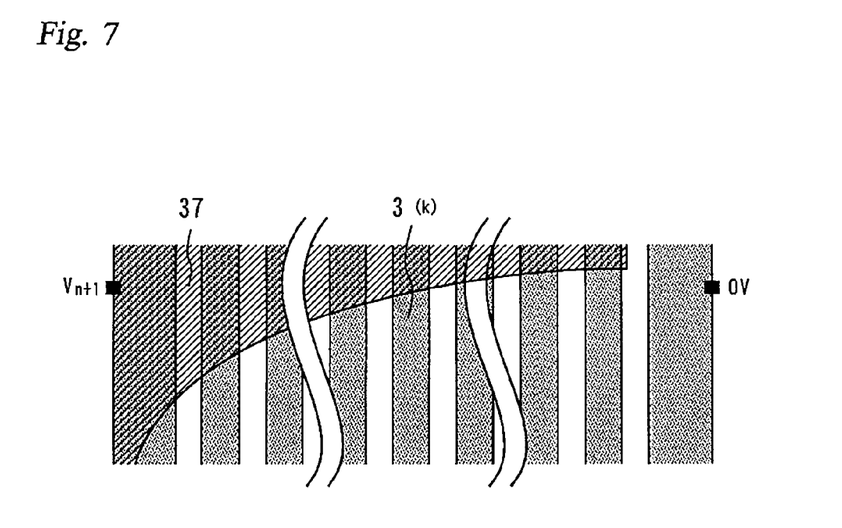
FIG. 7 is a top view of a semiconductor device in accordance with a ninth embodiment of the present invention.

FIG. 7 is a top view of a semiconductor device in accordance with a ninth embodiment of the present invention. The semiconductor device of the ninth embodiment differs from that of the fifth embodiment in that the electrode 7 is replaced by an electrode 37 which extends along and above the row of regions 3 and has such a configuration that the ratio of the value of the capacitance $a_k$ between the substrate and the region $3(k)$ to the value of the capacitance $c_k$ between the electrode 37 and the region $3(k)$ decreases with increasing value of k. More specifically, $a_k$ is constant with respect to the value of k, and $c_k$ changes with the value of k, as shown in FIG. 7. FIG. 7 is a top view of the electrode 37, and corresponds to a top view of the electrode 7 as viewed from above the substrate 1 in FIG. 2. As shown in FIG. 7, the width of the electrode 37 decreases with decreasing distance from the rightmost region $3(0)$, as viewed in FIG. 7, that is, decreases with decreasing value of k. Especially, in accordance with the present embodiment, the width of the electrode 37 decreases nonlinearly with decreasing value of k.

This method of the present embodiment is characterized in that the potentials of the floating regions $3(k)$ are not affected by the capacitances $b_k$. Specifically, if the sum of the second and third terms on the right-hand side of Equation (6) is zero, then the following equation holds.

$$a_k/c_k=(V_{n+1}-V_k)/V_k \quad (8)$$

This equation indicates that the ratio of $a_k$ to $c_k$ decreases with increasing value of k, meaning that the potential of each floating region $3(k)$ is not affected by the capacitance $b_k$.

As described above, if the dielectric strength between the electrode 37 and the underlying regions $3(k)$ must exceed a certain minimum value, then the electrode 37 may be formed so that it is capacitively coupled to only some regions $3(k)$ on the high potential side of the structure. Such configurations also provide beneficial effects. That is, the electrode 37 need not extend as close to the rightmost region $3(0)$ as shown in FIG. 7. For example, the electrode 37 may extend only along the upper side of one or a few regions 3 on the left side of the structure, as viewed in FIG. 7 (i.e., the regions $3(n)$, $3(n-1)$, etc.).

Tenth Embodiment

Figure 8:
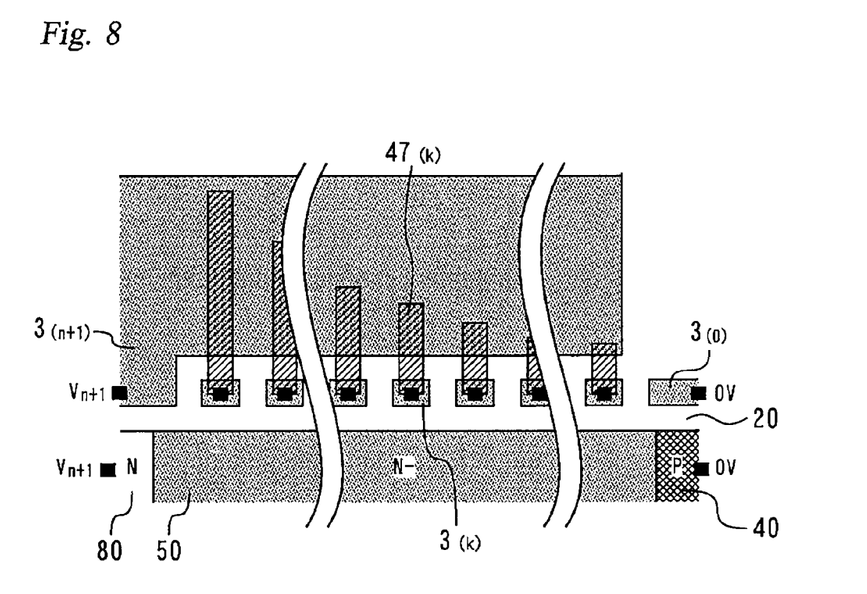
FIG. 8 is a top view of a semiconductor device in accordance with a tenth embodiment of the present invention.

FIG. 8 is a top view of a semiconductor device in accordance with a tenth embodiment of the present invention. The semiconductor device of the tenth embodiment is an improvement of that of the eighth embodiment shown in FIG. 6 to which the above concept of the ninth embodiment is applied.

Specifically, single electrodes $47(1), \ldots, 47(k), \ldots 47(n)$ extend from the floating regions $3(1), \ldots, 3(k), \ldots, 3(n)$, respectively, where n and k are positive integers. These electrodes 47 have different lengths and extend over the extended region 3 (n+1). The lengths of the electrodes $47(k)$ increase with increasing value of k. Especially, in accordance with the present embodiment, the lengths of the electrodes $47(k)$ increase exponentially (or nonlinearly) with increasing value of k (i.e., the rate of increase gradually increases with increasing value of k).

It should be noted that if the dielectric strength between the regions 3 separated by trenches must exceed a certain minimum value, then only some regions 3 on the high potential side of the semiconductor device may have an electrode 47 which is capacitively coupled to the region $3(n+1)$.

Eleventh Embodiment

Figure 9:
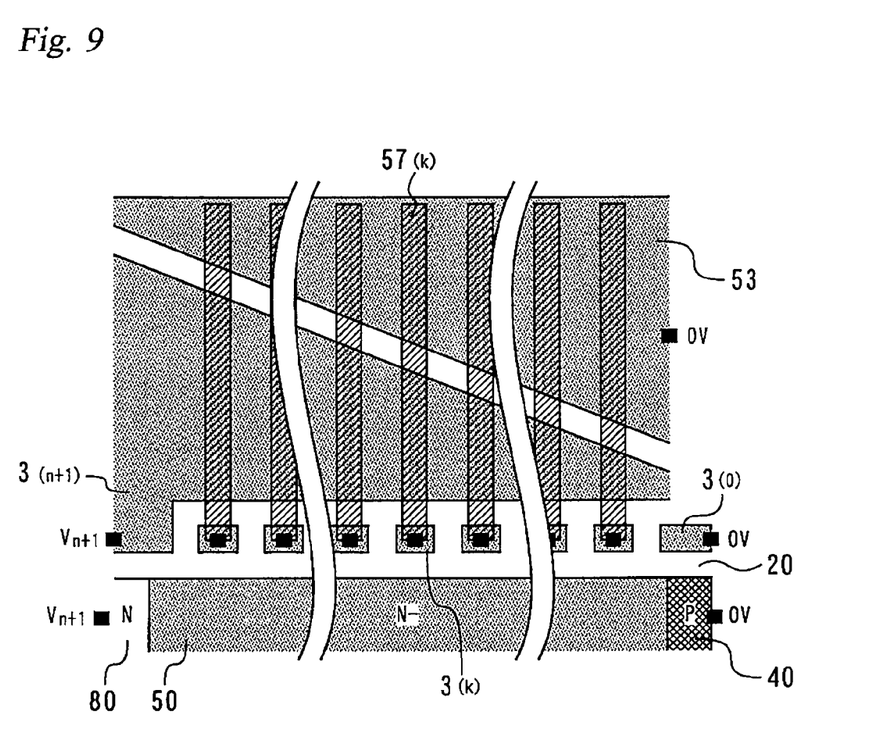
FIG. 9 is a top view of a semiconductor device in accordance with a eleventh embodiment of the present invention.

FIG. 9 is a top view of a semiconductor device in accordance with an eleventh embodiment of the present invention. The semiconductor device of the eleventh embodiment differs from that of the tenth embodiment in that it includes a zero potential region 53 and electrodes 57 instead of the electrodes 47. In this semiconductor device, the capacitance $a_k$ decreases and the capacitance $c_k$ increases with increasing value of k. This is accomplished by the following structure. In the semiconductor device of the present embodiment, the width of the region $3(n+1)$, i.e., the vertical dimension of the region $3(n+1)$, as viewed in FIG. 9, decreases linearly with decreasing distance from the rightmost region $3(0)$, as viewed in FIG. 9; that is, the width of the portion of the region $3(n+1)$ intersecting each electrode $57(k)$ decreases with decreasing value of k. On the other hand, the width of the zero potential region 53 (shown at the top of FIG. 9) increases proportionally to the decrease in width of the region $3(n+1)$.

In Equation (8), if $V_{n+1}-V_k$ is constant with respect to the value of k, the following equation holds.

$$a_k/c_k=(n+1-k)/k \quad (9)$$

For example, if $a_k \propto n+1-k$ and $c_k \propto k$, then $a_k+c_k=\text{const}$.

Therefore, the capacitances $a_k$ and $c_k$ may be varied, as shown in FIG. 9, by use of the electrodes 57, etc. so as to easily satisfy Equation (9). The structure of the present embodiment requires only linear patterns and does not require any special curved patterns, yet satisfies the above condition, resulting in simplified design and manufacture.

It should be noted that in each embodiment described above, the floating regions $3(k)$ correspond to the floating regions of the first or second aspect of the invention described in the Summary of the Invention section, the substrate 1 corresponds to the semiconductor substrate of the first or second aspect, and the insulating regions which form trenches for separating the regions 3 correspond to the insulating regions of the first or second aspect. Further, in each figure described above, the region $3(n+1)$ having a potential of $V_{n+1}$ V corresponds to the island region of a predetermined potential in the first or second aspect of the invention, the semiconductor material layer 10 corresponds to the semiconductor material layer of the first or second aspect, and the insulating layer 20 corresponds to the insulating layer of the first or second aspect.

Further, in the embodiments described above, the floating regions $3(1)$ to $3(n)$ correspond to the one or more floating regions of the first aspect of the invention, and particularly the floating region $3(n)$ corresponds to the first floating region of the first aspect. Further, in the embodiments described above, the external capacitances 6 together correspond to the capacitance forming portion of the first aspect.

It should be noted that in variations of the embodiments, external capacitances 6 may be connected to only some of the floating regions $3(1)$ to $3(n)$. In this case, the floating regions to which the external capacitances 6 are connected correspond to the one or more floating regions of the first aspect.

Further, in the embodiments described above, the floating regions $3(1)$ to $3(n)$ correspond to the one or more floating regions of the second aspect of the invention, and the electrodes 7, 17, 27, 37, 47, and 57 and the region $3(n+1)$ of the seventh, eighth, tenth, and eleventh embodiments correspond to the capacitance forming portion of the second aspect.

It should be noted that in variations of the fifth, sixth, and ninth embodiments, the electrode (7, 17, or 37) may extend only halfway along the row of floating regions $3(1)$ to $3(n)$. In this case, the floating regions 3 adjacent (and hence capacitively coupled to) the electrode correspond to the one or more floating regions of the second aspect of the invention. For example, in a variation of the fifth embodiment, the electrode 7 may extend only along the upper sides of the floating regions $3(n)$, $3(n-1)$, and $3(n-2)$. Further, in variations of the eighth and tenth embodiments, only some floating regions 3 on the high potential side of the semiconductor device (e.g., the floating regions $3(n)$, $3(n-1)$, and $3(n-2)$) may have an electrode which is capacitively coupled to the region $3(n+1)$. In this case, these floating regions 3 correspond to the one or more floating regions of the second aspect. Further, in variations of the seventh embodiment, the region $3(n+1)$ may extend only halfway along the row of floating regions $3(1)$ to $3(n)$. In this case, the floating regions adjacent (and hence capacitively coupled to) the region $3(n+1)$ correspond to the one or more floating regions of the second aspect. For example, the region $3(n+1)$ may extend only along sides of the floating regions $3(n)$, $3(n-1)$, and 3 (n-2).

It should be noted that the structure of each embodiment described above may be combined with the diode shown in FIG. 12 or any other semiconductor device, or alternatively it may be used independently. Specifically, for example, the ninth, tenth, and eleventh embodiments have been described in connection with the diodes shown in FIGS. 7, 8, and 9, respectively, which diodes correspond to the diode shown in FIG. 12. It should be noted, however, that the present invention is not limited to diodes. The structures of the ninth, tenth, and eleventh embodiments (which include the electrodes 37, 47, and 57, respectively, and the region $3(n+1)$) may also be applied to other semiconductor devices (e.g., ICs).

It should be noted that in each embodiment described above, the regions 3 (specifically, the floating regions $3(1)$ to $3(n)$ and the island region $3(n+1)$) and the semiconductor substrate (semiconductor material layer 10) may be formed of various types of conductive semiconductor materials. Specifically, the regions 3 and the semiconductor substrate may be made of various types of compound semiconductor materials other than silicon (Si). Further, they may be formed of wide bandgap semiconductor material having a wider bandgap than silicon. Examples of wide bandgap semiconductors include silicon carbide (SiC)— and gallium nitride-based materials and diamond. Even when a high voltage is applied to a plurality of floating regions of wide bandgap semiconductor having a high breakdown voltage, the structure of each embodiment of the present invention makes it possible to reduce the differences between the voltages between adjacent floating regions and thereby prevent a reduction in the overall breakdown voltage while effectively utilizing the electrical characteristics of the wide bandgap semiconductor.

Switching devices and diode devices formed of such a wide bandgap semiconductor can be of a reduced size since they have a high breakdown voltage and high current density capacity. Further, the reduced size of these switching devices and diode devices allows for a reduction in the size of the semiconductor modules containing them. Further, since wide bandgap semiconductors have high thermal resistance, it is possible to reduce the size of the radiating fins of heat sinks, or to use air cooling instead of water cooling, resulting in a further reduction in the size of the semiconductor modules. Further, since wide bandgap semiconductors provide low power loss, switching devices and diode devices formed of wide bandgap semiconductors have increased efficiency, making it possible to increase the efficiency of the semiconductor modules containing them. When both switching devices and diode devices are contained in the same semiconductor module, either the switching devices or diode devices, or preferably both, may be formed of wide bandgap semiconductor.

It should be noted that some compound semiconductor materials, e.g., SiC, can be used to form a pn junction. Therefore, for example, the structures of the second, fourth, and sixth embodiments (for increasing the breakdown voltage of a pn junction) may be applied to a pn junction formed of SiC to increase the breakdown voltage. Further, these structures may also be applied to pn junctions of other compound semiconductor material to increase the breakdown voltage.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-294408, filed on Dec. 29, 2010 including specification, claims, drawings and summary, on which the Convention priority of the present application is based, are incorporated herein by reference in its entirety.

What is claimed is:

1. A semiconductor device comprising:
    a plurality of floating regions arranged on a surface of a semiconductor substrate in a row, wherein the plurality of floating regions are provided with insulating regions therebetween and include a first floating region and a second floating region located farther than the first floating region from an island region of a predetermined potential on the semiconductor substrate;
    an insulating layer interposed between each of the plurality of floating regions and a semiconductor material layer of the semiconductor substrate; and
    a capacitance forming portion forming a capacitance in parallel with, and in addition to, either the capacitance of the insulating region between the first floating region and the island region of the predetermined potential, or the capacitance of the insulating region between each adjacent pair of floating regions of the plurality of floating regions, or both, the adjacent pair of floating regions including the first floating region, wherein
    the capacitance forming portion includes a plurality of capacitive elements,
    the capacitive elements on the side of the capacitance forming portion adjacent the first floating region have a greater capacitance than the capacitive elements on the side of the capacitance forming portion adjacent the second floating region, and
    the capacitance forming portion includes a capacitive element of the capacitive elements connected at a first end to a one floating region of an adjacent pair of floating regions and at a second end to another floating region of the adjacent pair of floating regions.

2. The semiconductor device according to claim 1, wherein
    at least one of the plurality of capacitive elements is connected between each adjacent pair of floating regions, and
    the plurality of capacitive elements are arranged along the row of the plurality of floating regions and connected in series with one another.

3. The semiconductor device according to claim 2, wherein the plurality of capacitive elements are arranged in the direction from the first floating region toward the second floating region, and the capacitances of the plurality of capacitive elements decrease as their distance from the first floating region increases.

4. The semiconductor device according to claim 3, wherein the capacitances of the plurality of capacitive elements decrease as a quadratic function of distance from the first floating region.

5. The semiconductor device according to claim 1, wherein the floating regions are formed of wide bandgap semiconductor material.

6. The semiconductor device according to claim 3, wherein the capacitances of the plurality of capacitive elements decrease non-linearly with increasing distance from the first floating region.

7. The semiconductor device according to claim 1, wherein the plurality of floating regions and the insulating layer are between the semiconductor material layer and the capacitance forming portion.

8. The semiconductor device of claim 1, wherein each of the plurality of capacitive elements includes a conductive plate arranged such that a line normal to the conductive plate is in the first direction.

9. A semiconductor device comprising:
    a plurality of floating regions arranged on a surface of a semiconductor substrate in a row, wherein the plurality of floating regions are provided with insulating regions therebetween and include a first floating region and a second floating region located farther than the first floating region from an island region of a predetermined potential on the semiconductor substrate;
    an insulating layer interposed between each of the plurality of floating regions and a semiconductor material layer of the semiconductor substrate; and
    a capacitance forming portion extending either along and above the semiconductor substrate, or along a side of the row of the plurality of floating regions on the surface of the semiconductor substrate, or both, so that the capacitance forming portion is capacitively coupled to one or more of the plurality of floating regions, the one or more floating regions including the first floating region, wherein the capacitance forming portion forms a capacitance in parallel with, and in addition to, either a capacitance of the insulating region between the first floating region and the island region of the predetermined potential, or a capacitance of the insulating region between each adjacent pair of floating regions of the plurality of floating regions, or both, the capacitances between the capacitance forming portion and the floating regions decrease with increasing distance from the first floating region, and the capacitance forming portion includes an electrode provided on the semiconductor substrate and extending along and above the one or more floating regions so that the electrode is capacitively coupled to the one or more floating regions, such that the capacitive coupling of the electrode forms the capacitances between the capacitive forming portion and the floating regions.

10. The semiconductor device according to claim 9, wherein the electrode extends from said first floating region toward the second floating region.

11. The semiconductor device according to claim 9, wherein the electrode extends from said first floating region toward the second floating region, and the width of the electrode decreases with increasing distance from the first floating region.

12. The semiconductor device according to claim 11, wherein the width of the electrode decreases non-linearly with increasing distance from the first floating region.

13. The semiconductor device according to claim 9, wherein the plurality of floating regions and the insulating layer are between the semiconductor material layer and the capacitance forming portion.

14. A semiconductor device comprising:
a plurality of floating regions arranged on a surface of a semiconductor substrate in a row, wherein the plurality of floating regions are provided with insulating regions therebetween and include a first floating region and a second floating region located farther than the first floating region from an island region of a predetermined potential on the semiconductor substrate;
an insulating layer interposed between each of the plurality of floating regions and a semiconductor material layer of the semiconductor substrate; and
a capacitance forming portion extending either along and above the semiconductor substrate, or along a side of the row of the plurality of floating regions on the surface of the semiconductor substrate, or both, so that the capacitance forming portion is capacitively coupled to one or more of the plurality of floating regions, the one or more floating regions including the first floating region, wherein
the capacitance forming portion forms a capacitance in parallel with, and in addition to, either a capacitance of the insulating region between the first floating region and the island region of the predetermined potential, or a capacitance of the insulating region between each adjacent pair of floating regions, or both,
the capacitances between the capacitance forming portion and the floating regions decrease with increasing distance from the first floating region, and
the capacitance forming portion includes a semiconductor region extending on the surface of the semiconductor substrate and along the row of the plurality of floating regions in such a manner that the semiconductor region extends along and adjacent to two or more of the plurality of floating regions with an insulating region between the semiconductor region and the two or more floating regions, such that a capacitive coupling of the semiconductor region with the one or more of the plurality of floating regions forms the capacitances between the capacitive forming portion and the floating regions.

15. The semiconductor device according to claim 14, wherein the capacitance forming portion includes one or more electrodes each provided to one of the one or more floating regions and extending from the floating region above the island region.

16. The semiconductor device according to claim 15, wherein:
the capacitance forming portion includes a plurality of the one or more electrodes each extending along and above the semiconductor region; and
the plurality of electrodes are arranged in the direction from the first floating region toward the second floating region, and extend a decreasing distance along and above the semiconductor region as the plurality of electrodes near the second floating region.

17. A semiconductor device comprising:
a plurality of floating regions arranged on a surface of a semiconductor substrate in a row, wherein the plurality of floating regions are provided with insulating regions therebetween and include a first floating region and a second floating region located farther than the first floating region from an island region of a predetermined potential on the semiconductor substrate;
an insulating layer interposed between each of the plurality of floating regions and a semiconductor material layer of the semiconductor substrate;
a capacitance forming portion forming a capacitance in parallel with, and in addition to, either the capacitance of the insulating region between the first floating region and the island region of the predetermined potential, or the capacitance of the insulating region between each adjacent pair of floating regions of the plurality of floating regions, or both, the adjacent pair of floating regions including the first floating region; and
a semiconductor element provided on the surface of the semiconductor device and adjacent to the plurality of floating regions with an insulating region between the semiconductor element and the plurality of floating regions, the semiconductor element having a first conductivity type region on a side adjacent to the first floating region and having a second conductivity type region on a side adjacent to the second floating region, wherein
the capacitance forming portion includes a plurality of capacitive elements, and
the capacitive elements on the side of the capacitance forming portion adjacent the first floating region have a greater capacitance than the capacitive elements on the side of the capacitance forming portion adjacent the second floating region.

18. The semiconductor device according to claim 17, wherein the semiconductor element further includes a diode having a n-type region on the side adjacent to the first floating region and a p-type region on the side adjacent to the second floating region.

* * * * *